United States Patent
Kato et al.

(10) Patent No.: US 7,063,899 B2
(45) Date of Patent: Jun. 20, 2006

(54) COMPOSITIONAL BUFFERS FOR ELECTRONIC CERAMICS CONTAINING VOLATILE ELEMENTS AND THE FABRICATION METHOD

(75) Inventors: Kazumi Kato, Aichi (JP); Takeshi Miki, Aichi (JP); Kaori Nishizawa, Aichi (JP); Kazuyuki Suzuki, Aichi (JP); Desheng Fu, Aichi (JP); Hiroshi Ishiwara, Tokyo (JP)

(73) Assignees: National Institute of Advanced Industrial Science and Technology, Tokyo (JP); Tokyo Institute of Technology, Tokyo (JP)

( * ) Notice: Subject to any disclaimer, the term of this patent is extended or adjusted under 35 U.S.C. 154(b) by 262 days.

(21) Appl. No.: 10/650,672

(22) Filed: Aug. 29, 2003

(65) Prior Publication Data

US 2004/0115441 A1  Jun. 17, 2004

(30) Foreign Application Priority Data

Sep. 2, 2002  (JP) ............................. 2002-256958

(51) Int. Cl.
  *B32B 9/00* (2006.01)
  *B05D 5/12* (2006.01)
(52) U.S. Cl. .................. 428/689; 428/446; 428/426; 428/427; 428/428; 428/704; 427/58; 427/126.1; 427/126.2
(58) Field of Classification Search ................ 428/689, 428/446, 426, 427, 428, 704; 427/58, 126.1, 427/126.2
See application file for complete search history.

(56) References Cited

U.S. PATENT DOCUMENTS 5,925,183 A  7/1999  Kato et al.
5,948,536 A *  9/1999  Suzuki et al. ............... 428/426

FOREIGN PATENT DOCUMENTS

JP  03-041411  2/1991
JP  03-044304  2/1991

* cited by examiner

*Primary Examiner*—Ling X. Xu
(74) *Attorney, Agent, or Firm*—Oblon, Spivak, McClelland, Maier & Neustadt, P.C.

(57) ABSTRACT

The present invention provides compositional buffers for electronic ceramics containing volatile elements, and a method for manufacturing and using the same. The surfaces of the fine crystal grains that make up an electronic ceramic such as a bismuth-based laminar compound or lead-based perovskite compound containing highly volatile cations such as bismuth or lead, or a thin film thereof, are covered compositional buffer composed of a silicate- or borate-based compound that readily forms an amorphous structure, and also provided is a method for manufacturing an electronic ceramic using the compositional buffer.

12 Claims, 5 Drawing Sheets

COMPOSITIONAL BUFFERS FOR ELECTRONIC CERAMICS CONTAINING VOLATILE ELEMENTS AND THE FABRICATION METHOD

BACKGROUND OF THE INVENTION

1. Field of the Invention

The present invention relates to compositional buffers composed of a silicate- or borate-based compound that readily forms an amorphous structure, and a method for manufacturing the compositional buffers, as well as to a method for manufacturing electronic ceramics, and more particularly relates to novel compositional buffers and method for manufacturing the same, and a method for manufacturing electronic ceramics using the compositional buffers, with which the surfaces of the fine crystal grains of an electronic ceramic containing highly volatile cations of bismuth, lead, or the like, or a thin film thereof, are covered with the above-mentioned compositional buffer by chemical solution method in the process of synthesizing an electronic ceramic containing a volatile element or a thin film thereof, thereby preventing the loss of components through volatilization, preventing the precipitation of metal at the grain boundary by incorporating any cations that have been added in excess into the amorphous structure, and enabling the electronic ceramic or thin film thereof to be maintained at its stoichiometric composition.

2. Description of the Related Art

In the synthesis of an electronic ceramic or thin film thereof such as a ferroelectric or superconductor of a bismuth-based laminar compound or lead-based perovskite compound containing highly volatile cations such as bismuth or lead, the bismuth, lead, or the like volatilizes in the course of sintering during the synthesis process, which has led to the adoption of methods in which an organometallic salt or an oxide powder containing an excess amount of bismuth, lead, or the like is added ahead of time to the raw material solution or powder, or in which the sintering is performed in an atmosphere saturated with bismuth, lead, or another such volatile element. When an excess amount of a volatile element is thus added externally, the volatile metal element added in excess evaporates away during high-temperature sintering, the result being that an electronic ceramic or thin film thereof that is free of compositional defects can be synthesized.

An electronic ceramic or thin film thereof synthesized by a conventional method is premised on the fact that the volatilization of the volatile element added in excess will be volatilized in the course of the high-temperature sintering performed during the manufacturing process, resulting in the composition being close to the stoichiometric composition. However, while such a method is suitable when the sintering reaction is conducted at high temperature, if the sintering is performed at low temperature, or if there is a change in the sintering time, firing atmosphere, or sample shape, the volatilization rate will vary, so the volatile element may remain behind, or remaining volatile element cations may be reduced and precipitated in the form of a metal. An element that precipitates in the form of a metal diminishes the characteristics of the electronic ceramic or thin film thereof. Therefore, conventional methods were not suited to the synthesis of electronic ceramics or thin films thereof at low temperature.

In light of the above-mentioned prior art, the inventors conducted diligent research aimed at developing a novel synthesis method in which an electronic ceramic containing a volatile element such as bismuth or lead or a thin film thereof is synthesized at low temperature and adjusted to its stoichiometric composition. As a result, they arrived at the present invention upon discovering that if the surfaces of the fine crystal grains that make up an electronic ceramic or thin film thereof are covered by chemical solution method with a silicate- or borate-based compound that readily forms an amorphous structure, loss of composition that would otherwise be caused by volatilization can be prevented, and if cations of a volatile element that has added in excess are incorporated into an amorphous structure, the precipitation of metal at the grain boundary can be prevented, allowing the electronic ceramic or thin film thereof to be maintained at its stoichiometric composition.

SUMMARY OF THE INVENTION

Specifically, it is an object of the present invention to provide a novel compositional buffer and method for manufacturing the same, and an economical and environmentally friendly method for manufacturing an electronic ceramic containing a volatile element using this compositional buffer, with which the above-mentioned electronic ceramic or a thin film thereof can be synthesized compactly and at low temperature, in a stoichiometric composition, without the volatile element being released in the course of this synthesis, and the electronic ceramic or thin film thereof will exhibit excellent characteristics as a superconductor, ferroelectric, piezoelectric, or the like.

To achieve the stated object, the present invention is constituted by the following technological means.

(1) A compositional buffer having the faction of maintaining an electronic ceramic containing a volatile element, or a thin film thereof, at its stoichiometric composition by covering the surfaces of the fine crystal grains that make up said electronic ceramic or thin film thereof with the compositional buffer in the process of synthesizing said electronic ceramic or thin film thereof, wherein said compositional buffer is composed of a silicate- or borate-based compound that readily forms an amorphous structure.

(2) The compositional buffer according to (1) above, wherein the electronic ceramic containing a volatile element or thin film thereof is composed of a bismuth-based laminar compound or lead-based perovskite compound containing highly volatile cations typified by bismuth or lead.

(3) The compositional buffer according to (1) above, wherein an alkoxide of silicon or an alkoxide of boron is used as the silicate- or borate-based compound.

(4) The compositional buffer according to (1) above, wherein the surfaces of the fine crystal grains that make up the electronic ceramic containing a volatile element or thin film thereof are covered with a silicate- or borate-based compound that readily forms an amorphous structure by chemical solution method.

(5) A method for manufacturing a compositional buffer that covered on the surfaces of the fine crystal grains that make up an electronic ceramic containing a volatile element or a thin film thereof, comprising covering the surfaces of the fine crystal grains that make up the electronic ceramic or thin film thereof with a silicate-based compound or borate-based compound that readily forms an amorphous structure by chemical solution method.

(6) A method for manufacturing an electronic ceramic containing a volatile element or a thin film thereof, in which the stoichiometric composition is controlled, comprising covering the surfaces of the fine crystal grains that make up the electronic ceramic containing a volatile element or thin film thereof with the compositional buffer according to any one of (1) to (4) above by chemical solution method.

(7) The method according to (6) above, wherein the electronic ceramic containing a volatile element or thin film thereof is composed of a bismuth-based laminar compound or lead-based perovskite compound containing highly volatile cations typified by bismuth or lead.

(8) The method according to (6) above, wherein an alcohol solution of a metal organic acid salt or an organometallic compound is used as the raw material solution of the electronic ceramic or thin film thereof.

(9) The method according to (6) above, wherein the surfaces of the fine crystal grains that make up the electronic ceramic containing a volatile element or thin film thereof are covered by evaporating to dryness a uniform mixed solution of the compositional buffer and the raw material solution of the electronic ceramic or thin film thereof.

(10) The method according to (6) above, wherein the surfaces of the fine crystal grains that make up the electronic ceramic containing a volatile element or thin film thereof are covered by coating a substrate with a uniform mixed solution of the compositional buffer and the raw material solution of the electronic ceramic or thin film thereof, and then heating.

(11) The method according to (6) above, wherein metallization at the grain boundary of the highly volatile cations typified by bismuth or lead is prevented by covering the surfaces of the fine crystal grains that make up the electronic ceramic containing a volatile element or thin film thereof with the compositional buffer.

(12) The method according to (6) above, wherein any highly volatile cations typified by bismuth or lead that have been added in excess are incorporated into the amorphous structure by covering the surfaces of the fine crystal grains that make up the electronic ceramic containing a volatile element or thin film thereof with the compositional buffer.

DESCRIPTION OF THE PREFERRED EMBODIMENTS

Figure 1:
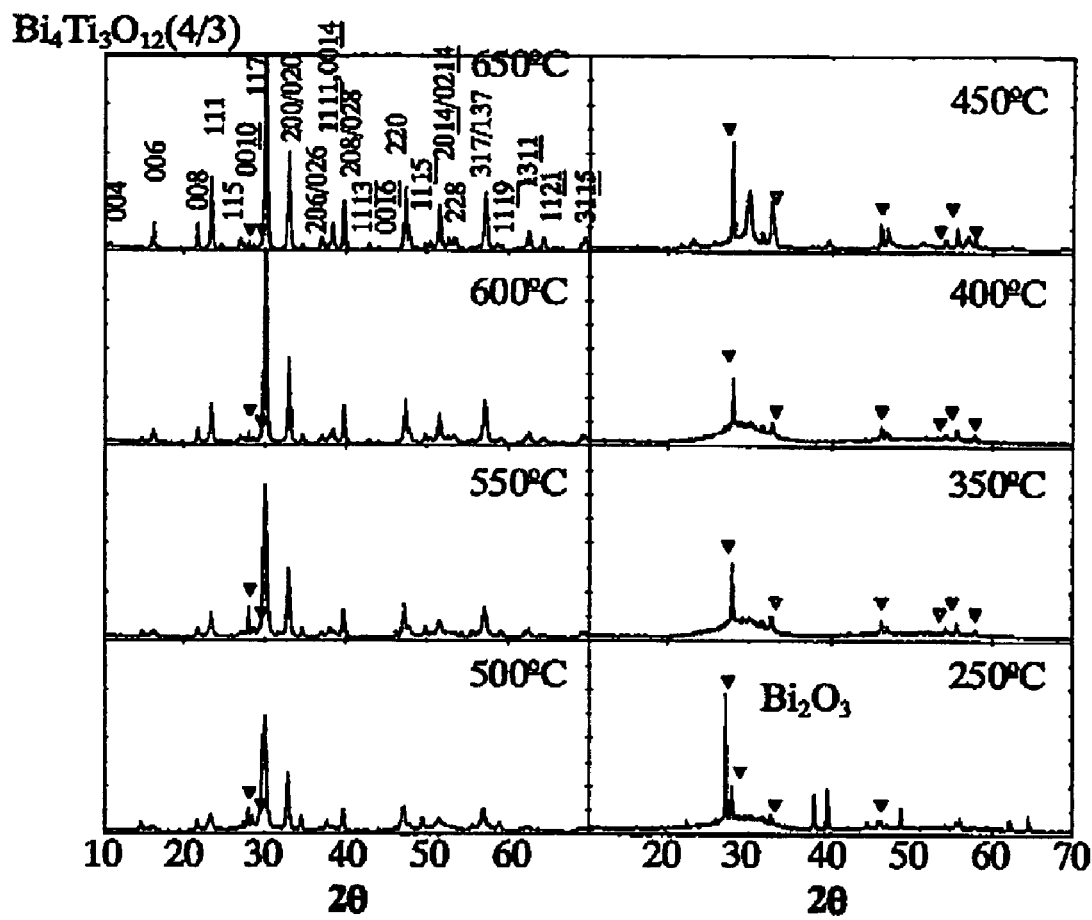
FIG. 1 shows the X-ray diffraction pattern of a powder produced from a bismuth titanate raw material solution with a bismuth/titanium atomic ratio of 4/3.

The present invention will now be described in further detail.

The raw material solution of the electronic ceramic or thin film thereof used in the present invention is composed of an alcohol solution produced by dissolving a volatile element typified by bismuth or lead and a metal organic acid salt or an organometallic compound such as a metal alkoxide of another element in an alcohol solvent. A stabilizer can be added to this if needed. With the present invention, a silicate- or borate-based compound, and preferably an alkoxide of silicon or boron, is added as the compositional buffer raw material to this solution, and the system is stirred at room temperature or at the boiling point of the alcohol used as the solvent, to prepare a uniform mixed solution. This mixed solution is either evaporated to dryness to produce a powder, or is used to coat a substrate and then heated, which synthesizes an electronic ceramic thin film uniformly containing a compositional buffer.

In the present invention, "electronic ceramic" refers to a functional oxide such as a dielectric, ferroelectric, piezoelectric, or superconductor.

The metal organic acid salt or organometallic compound such as a metal alkoxide used in the present invention to prepare the raw material solution of the electronic ceramic or thin film thereof contains a volatile element such as bismuth, lead, or vanadium, but all metal elements can be used, including titanium, tantalum, niobium, zirconium, lanthanum, tungsten, manganese, magnesium, nickel, copper, zinc, aluminum, tin, and other such elements. Of these, particularly favorable examples include metal organic acid salts and organometallic compounds such as metal alkoxides of titanium, tantalum, niobium, and the like as the other elements, but the present invention is not limited to these, and element that forms a uniform solution can be used as appropriate. Specific examples of a bismuth-based laminar compound or lead-based perovskite compound containing highly volatile cations typified by bismuth or lead include $MBi_2Ta_2O_9$ (M: alkaline earth metal), $MBi_2Nb_2O_9$ (M: alkaline earth metal), $Bi_4Ti_3O_{12}$, $Bi_4$ (Ti, La)$_3O_{12}$, $MBi_4Ti_4O_{15}$ (M: alkaline earth metal), $M_2Bi_4Ti_5O_{18}$ (M: alkaline earth metal), or another such Aurivillius compound and solid solutions of these, and $PbTiO_3$, $PbZrO_3$, $Pb(Zr, Ti)O_3$, $(Pb, La)(Zr, Ti)O_3$, $Pb(Mg, Nb)O_3$, or the like and solid solutions of these.

Favorable examples of stabilizers that can be added to the above-mentioned solution include acetylacetone and alkanolamines, although other compounds can also be used.

Examples of the silicate- or borate-based compound used as the raw material for the compositional buffer include $SiO_2$, $B_2O_3$, $SiO_2$—$B_2O_3$, $Bi_2O_3$—$SiO_2$, $PbO$—$SiO_2$, $Bi_2O_3$—$B_2O_3$, $PbO$—$B_2O_3$, $Bi_2O_3$—$SiO_2$—$B_2O_3$, and $PbO$—$SiO_2$—$B_2O_3$. An alkoxide of silicon or boron is particularly favorable. With the present invention, the metal organic acid salt or organometallic compound such as a metal alkoxide of a volatile element such as bismuth or lead may be added along with the alkoxide of silicon or boron, or may be added separately.

Examples of favorable methods for coating a substrate with the above-mentioned mixed solution include spin coating, dip coating, misting, spraying, and screen printing, although this list is not meant to be comprehensive, and any method with which a substrate can be uniformly coated with a mixed raw material solution of an electronic ceramic and a compositional buffer can be used as appropriate.

There are no restrictions on the conditions during coating with the above-mentioned mixed solution or evaporating this solution to dryness, as long as the temperature is at least 500° C., at which the organic matter will completely disappear, but since a large increase in the heating temperature will result in crystallization of the amorphous structure, it is preferable for the temperature to be low enough that the resulting electronic ceramic or thin film thereof will be sufficiently crystalline, with a range of 500 to 750° C. being especially good.

Examples of substrates include silicon, metal, glass, quartz, ceramic, and oxide monocrystals, but this list is not meant to be comprehensive, and the substrate can be any material capable of withstanding the heating temperature. Nor are there any particular restrictions on the shape of the substrate, but examples include sheet-form, cylindrical, prismatic, conical, spherical, and fibrous.

Thus, with the present invention, the uniform mixed solution obtained by the above method is either evaporated to dryness to synthesize a powder, or this solution is used to coat a substrate by spin coating, dip coating, misting, spraying, screen printing, or another such method, after which this coating is heat treated at a temperature of at least 500° C., which covers the surfaces of the crystal grains that make up the electronic ceramic or thin film thereof with the compositional buffer.

The present invention allows a stoichiometric composition to be achieved and prevents the defects in chemical composition that would be caused by metallization at the grain boundary or by loss of volatile elements in the course of producing an electronic ceramic containing a highly volatile element typified by bismuth or lead or a thin film thereof.

The compositional buffer synthesized with the present invention is particularly characterized in that 1) the added amount thereof is preferably 5 to 30 mol % with respect to the electronic ceramic or thin film thereof, 2) any excess volatile element up to 10 mol % with respect to the stoichiometric composition of the electronic ceramic or thin film thereof can be incorporated into an amorphous structure, 3) there is no metallization of the volatile element at the grain boundary, 4) the crystal grains that make up the electronic ceramic or thin film thereof can be uniformly covered, 5) an electronic ceramic containing a volatile element or a thin film thereof can be manufactured stoichiometrically, and so forth.

In general, it is considered desirable if an electronic ceramic or thin film thereof produced by chemical solution method has a highly homogeneous chemical composition, and if the components thereof crystallize at a relatively low temperature. With the present invention, as shown in specific terms in the examples given below, when bismuth silicate or bismuth titanate is used, for instance, it is believed that bismuth oxide in the silica phase and titania phase forming the amorphous structure crystallizes and precipitates in advance at a low temperature of 250° C. or lower. As the heating temperature rises, the bismuth oxide reacts with its surrounding amorphous phase, crystallizing into bismuth silicate or bismuth titanate. Also, as shown in specific terms in the examples given below, with a bismuth titanate powder containing an excess of bismuth (bismuth/titanium atomic ratio: 4.4/3), for instance, there is not enough amorphous titania to form bismuth titanate, and as a result a large amount of bismuth oxide remains behind. Meanwhile, with bismuth titanate to which 5 mol % bismuth silicate has been added, the amount of remaining bismuth oxide is kept low despite the addition of a larger total amount of bismuth being added. A larger amount of bismuth oxide reacts with the amorphous silica phase and is consumed than with a stoichiometric composition, which results in a reduction in the amount of residual bismuth oxide.

Also, no diffraction peak for bismuth silicate was observed in the results of X-ray diffraction of a powder produced from a bismuth titanate/bismuth silicate mixed solution, the reason for which is that a small amount of bismuth silicate surrounded the bismuth titanate crystal grains in the form of a thin layer. Furthermore, even if the composition of the mixed raw material solution varies, the composition will still be stoichiometric, with no change in the lattice spacing (d) of the bismuth titanate powder heat treated at 650° C. (Δd will be 0.005 or less). These facts indicate that the silicate compound surrounding the crystal grains that make up the bismuth titanate or other electronic ceramic or thin film thereof prevent the volatilization of the bismuth oxide, or react with excess bismuth oxide and absorb it into the structure, the effect being that this compound functions as a compositional buffer having the action of preventing bismuth oxide from being reduced and precipitating in the form of metal at the grain boundary. The same applies to a borate compound.

EXAMPLES

The present invention will now be described in specific terms through examples, but is not limited in any way to or by these examples.

Example 1

(1) Preparation of Mixed Raw Material Solution

In this example, a bismuth titanate powder containing bismuth silicate as a compositional buffer was produced.

The mixed raw material solution used to produce the bismuth titanate powder that contained bismuth silicate as a compositional buffer was prepared as follows. Bismuth titanate raw material solutions having two different compositions were prepared by dissolving bismuth ethylhexanoate and titanium isopropoxide in normal butanol such that the bismuth/titanium atomic ratio would be 4.4/3 or 4/3 and the bismuth titanate content would be 5 mol %. Meanwhile, a bismuth silicate raw material solution was prepared by dissolving bismuth ethylhexanoate and tetraethyl silicate in normal butanol such that the bismuth/silicon atomic ratio would be 2/1 and the bismuth silicate content would be 3 wt %. The bismuth titanate raw material solutions with two different compositions and the bismuth silicate raw material solution were mixed at room temperature so that the bismuth silicate/bismuth titanate molar ratio would be 5 mol %.

(2) Production of Bismuth Titanate Powder Containing a Compositional Buffer

The mixed raw material solution produced above was drawn up under reduced pressure by a rotary pump, and the evaporated solvent was cooled and liquefied with liquid nitrogen to separate and remove the solvent. The highly viscous gel thus obtained was heat treated in the air at a specific temperature to produce a powder.

(3) Measurement Methods

X-ray powder diffraction and FT-Raman spectroscopy were employed to examine the crystal structure and crystallinity of the powder produced above.

(4) Results

Figure 2:
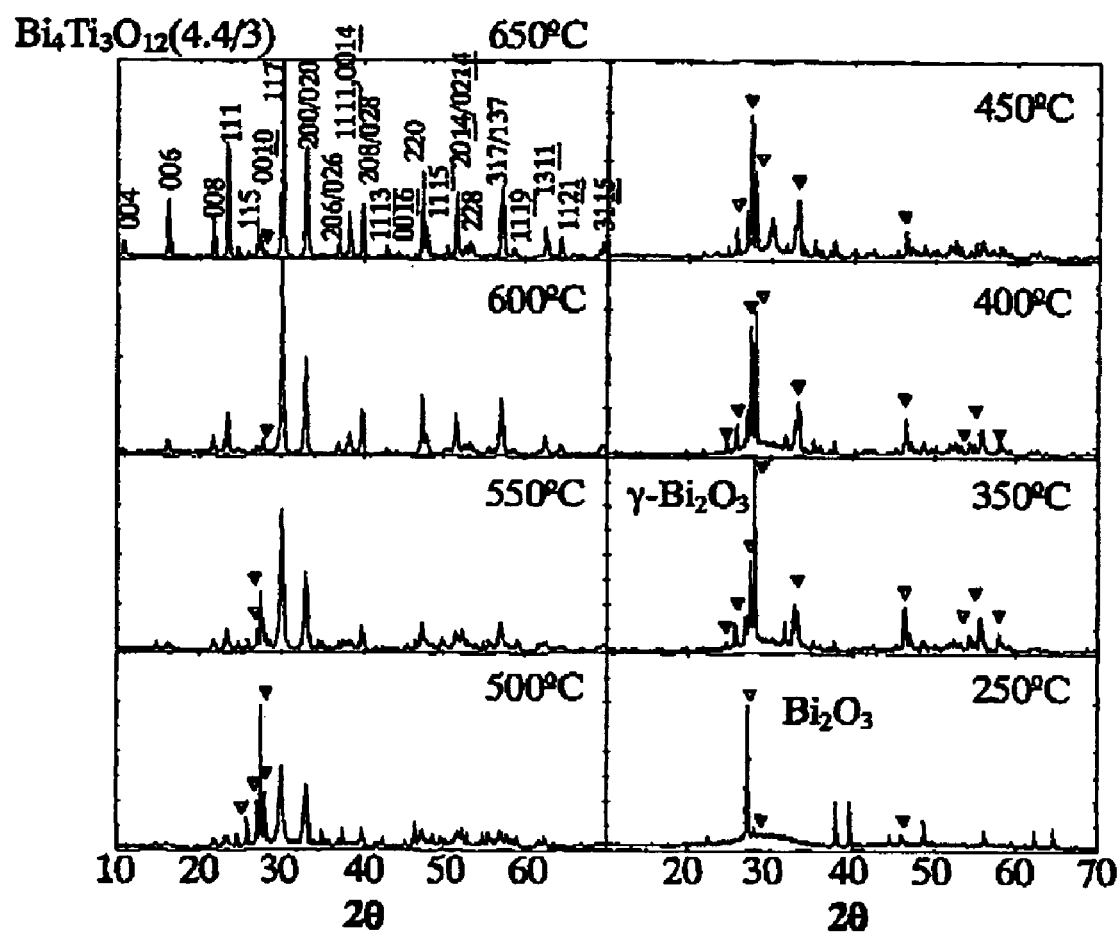
FIG. 2 shows the X-ray diffraction pattern of a powder produced from a bismuth titanate raw material solution with a bismuth/titanium atomic ratio of 4.4/3.

When the gel produced from the two different solution raw materials whose bismuth/titanium atomic ratios were 4.4/3 and 4/3 was heat treated for 2 hours at 250° C., the powder thus produced was a mixed phase composed of bismuth oxide and an amorphous phase. With a powder heat treated at 450° C., the bismuth titanate began to crystallize, but consisted of a mixture of bismuth oxide and an amorphous phase. Meanwhile, with a powder heat treated at 500° C., the main phase was bismuth titanate, but bismuth oxide still remained. The amount of residual bismuth oxide was a function of the bismuth/titanium atomic ratio of the raw material solution, increasing along with the bismuth ratio. With a powder heat treated between 500 and 650° C., the amount of residual bismuth oxide decreased as the heating temperature rose (FIGS. 1 and 2).

Figure 3:
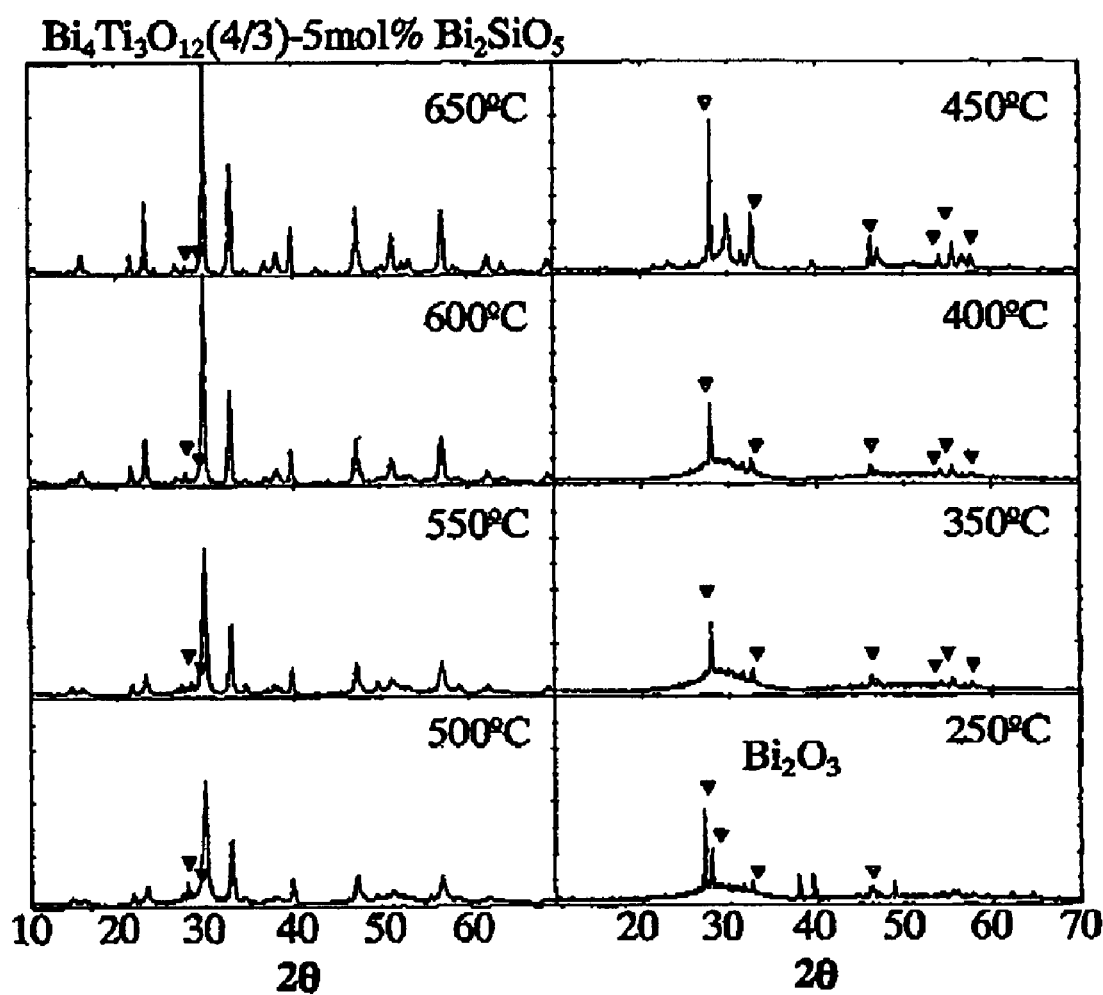
FIG. 3 shows the X-ray diffraction pattern of a powder produced from a mixed raw material solution of bismuth silicate and bismuth titanate (4/3)
Figure 4:
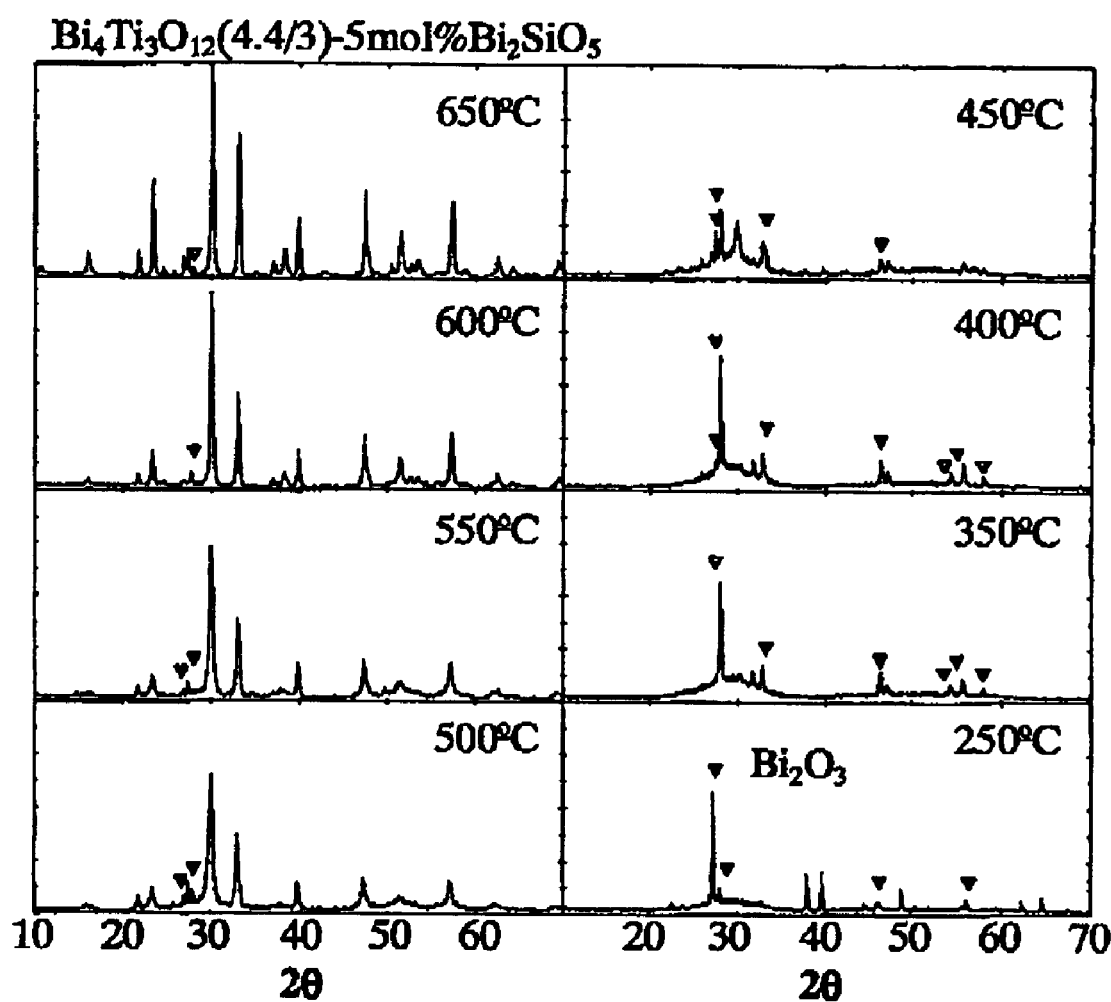
FIG. 4 shows the X-ray diffraction pattern of a powder produced from a mixed raw material solution of bismuth silicate and bismuth titanate (4.4/3)

When the gel produced from the bismuth titanate/bismuth silicate mixed raw material solution to which 5 mol % bismuth silicate had been added was heat treated at 250° C., the powder thus produced was a mixed phase composed of bismuth oxide and an amorphous phase. With a powder heat treated at 450° C., the bismuth titanate began to crystallize, but consisted of a mixture of bismuth oxide and an amorphous phase. Meanwhile, with a powder heat treated at 500° C., the main phase was bismuth titanate, but bismuth oxide still remained. The amount of residual bismuth oxide remained substantially constant regardless of the bismuth/titanium atomic ratio of the raw material solution. With a powder heat treated between 500 and 650° C., the amount of residual bismuth oxide decreased as the heating temperature rose (FIGS. 3 and 4).

It is clear from the precision X-ray measurement of the above-mentioned four types of powder produced by heat treatment at 650° C. that there is no change in the lattice spacing (d) of the bismuth titanate among the four types, and all four have the same stoichiometric composition.

Figure 5:
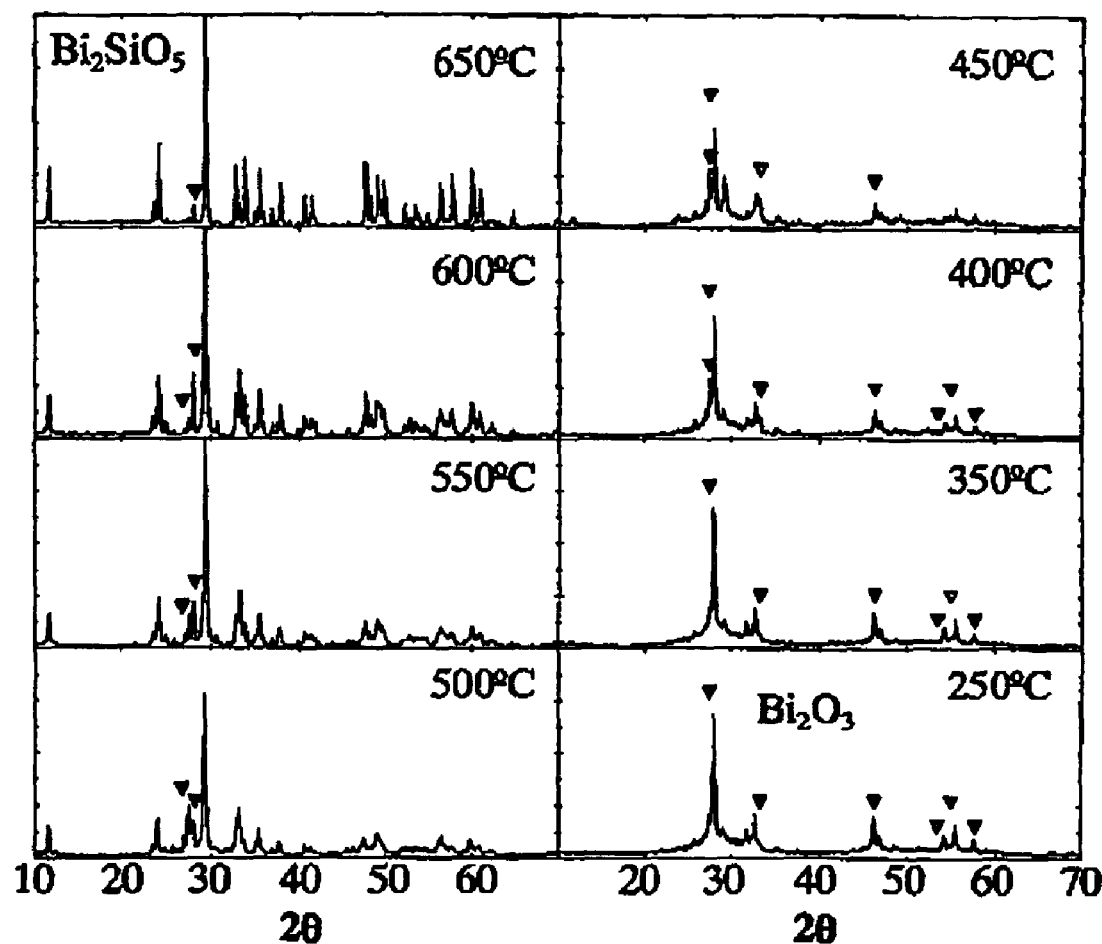
FIG. 5 shows the X-ray diffraction pattern of a powder produced from a bismuth silicate raw material solution.

When the gel produced from the bismuth silicate raw material solution was heat treated at 250° C., the powder thus produced was a mixed phase composed of bismuth oxide and an amorphous phase. With a powder heat treated at 450° C., the bismuth silicate began to crystallize, but consisted of a mixture of bismuth oxide and an amorphous phase. Meanwhile, with a powder heat treated at 500° C., the main phase was bismuth silicate, but bismuth oxide still remained. With a powder heat treated between 500 and 650° C., the amount of residual bismuth oxide decreased as the heating temperature rose (FIG. 5).

FT-Raman spectroscopy confirmed that the bismuth titanate and bismuth silicate began to crystallize at 450° C.

As indicated by the above results, with a mixed system of bismuth silicate and bismuth titanate, the bismuth seems to crystallize and precipitate before anything else, at a low temperature of 250° C. or lower, in the silica phase and titania phase that form the amorphous structure. As the heating temperature rises, the bismuth oxide reacts with its surrounding amorphous phase, crystallizing into bismuth silicate or bismuth titanate. With a bismuth titanate powder containing an excess of bismuth (bismuth/titanium atomic ratio: 4.4/3), there is not enough amorphous titania to form bismuth titanate, and as a result a large amount of bismuth oxide remains behind. Meanwhile, with bismuth titanate to which 5 mol % bismuth silicate has been added, less bismuth oxide remains behind even though a larger total amount of bismuth has been added. The reason for this seems to be that a larger amount of bismuth oxide reacts with the amorphous silica phase and is consumed than with a stoichiometric composition, which results in a reduction in the amount of residual bismuth oxide.

However, no diffraction peak for bismuth silicate was seen in the X-ray diffraction results for the powder produced from the bismuth titanate/bismuth silicate mixed solution. This is because a small amount of bismuth silicate surrounds the bismuth titanate crystal grains in the form of a thin layer. It is also clear that even if the composition of the mixed raw material solution varies, and that the composition is still stoichiometric, with no change in the lattice spacing (d) of the bismuth titanate powder heat treated at 650° C. (Δd will be 0.005 or less).

These results indicate that the silicate-based compound surrounding the bismuth titanate crystal grains prevents the volatilization of the bismuth oxide, or reacts with any excess bismuth oxide and absorbs it into the structure, the effect being that this compound functions as a compositional buffer that prevents bismuth oxide from being reduced and precipitating in the form of metal at the grain boundary.

As detailed above, the present invention provides a novel compositional buffer and method for manufacturing the same, and a method for manufacturing an electronic ceramic using this compositional buffer, with which the surfaces of the fine crystal grains of an electronic ceramic containing highly volatile cations of bismuth, lead, or the like, or a thin film thereof, are covered with a compositional buffer composed of a silicate- or borate-based compound that readily forms an amorphous structure, thereby preventing the loss of components through volatilization, and preventing the precipitation of metal at the grain boundary by incorporating any cations that have been added in excess into the amorphous structure, thereby maintaining the above-mentioned electronic ceramic or thin film thereof at its stoichiometric composition.

With the present invention, the content of silicate- or borate-based compound is varied between 5 and 30 mol %, which makes it possible to adjust the excess amount of volatile element to 10 mol % with respect to the targeted electronic ceramic or thin film thereof. The compositional buffer pertaining to the present invention, and the method for manufacturing an electronic ceramic using this compositional buffer, can be usefully applied to a variety of materials, such as superconductors, ferroelectrics, and piezoelectrics.

What is claimed is:

1. An electronic ceramic comprising a compositional buffer which surrounds the surfaces of fine crystal grains that make up the electronic ceramic containing a volatile element or thin film thereof in the form of a thin layer, characterized in that said compositional buffer has a function of maintaining the chemical composition of the electronic ceramic or a thin film thereof at its stoichiometric composition, and said compositional buffer is composed of a silicate- or borate-based compound that readily forms an amorphous structure.

2. The electronic ceramic according to claim 1, wherein the electronic ceramic containing a volatile element or thin film thereof is composed of a bismuth-based laminar compound or lead-based perovskite compound containing highly volatile cations typified by bismuth or lead.

3. The electronic ceramic according to claim 1, wherein the silicate- or borate-based compound is an alkoxide of silicon or an alkoxide of boron.

4. The electronic ceramic according to claim 1, wherein a silicate- or borate-based compound that readily forms an amorphous structure is coated on the surfaces of the fine crystal grains that make up the electronic ceramic containing a volatile element or thin film thereof by chemical solution method.

5. A method for manufacturing a electronic ceramic according to claim 1,
comprising covering the surfaces of the fine crystal grains that make up the electronic ceramic containing a volatile element or thin film thereof with a silicate-based compound or borate-based compound that readily forms an amorphous structure by chemical solution method.

6. A method for manufacturing an electronic ceramic containing a volatile element or a thin film thereof, in which the stoichiometric composition is controlled, comprising covering the surfaces of the fine crystal grains that make up the electronic ceramic containing a volatile element or thin film thereof with the compositional buffer according to any one of claims 3 or 1 by chemical solution method.

7. The method according to claim 6, wherein the electronic ceramic containing a volatile element or thin film thereof is composed of a bismuth-based laminar compound or lead-based perovskite compound containing highly volatile cations typified by bismuth or lead.

8. The method according to claim 6, wherein an alcohol solution of a metal organic acid salt or an organometallic compound is used as the raw material solution of the electronic ceramic or thin film thereof.

9. The method according to claim 6, wherein the surfaces of the fine crystal grains that make up the electronic ceramic containing a volatile element or thin film thereof are covered by evaporating to dryness a uniform mixed solution of the compositional buffer and the raw material solution of the electronic ceramic or thin film thereof.

10. The method according to claim 6, wherein the surfaces of the fine crystal grains that make up the electronic ceramic containing a volatile element or thin film thereof are covered by coating a substrate with a uniform mixed solution of the compositional buffer and the raw material solution of the electronic ceramic or thin film thereof, and then heating.

11. The method according to claim 6, wherein metallization at the grain boundary of the highly volatile cations typified by bismuth or lead is prevented by covering the surfaces of the fine crystal grains that make up the electronic ceramic containing a volatile element or thin film thereof with the compositional buffer.

12. The method according to claim 6, wherein any highly volatile cations typified by bismuth or lead that have been added in excess are incorporated into the amorphous structure by covering the surfaces of the fine crystal grains that make up the electronic ceramic containing a volatile element or thin film thereof with the compositional buffer.

* * * * *